United States Patent
McCauley et al.

(10) Patent No.: US 6,728,914 B2
(45) Date of Patent: Apr. 27, 2004

(54) RANDOM PATH DELAY TESTING METHODOLOGY

(75) Inventors: Kevin William McCauley, Greene, NY (US); William Vincent Huott, Holmes, NY (US); Mary Prilotski Kusko, Hopewell Junction, NY (US); Peilin Song, Lagrangeville, NY (US); Richard Frank Rizzolo, Red Hook, NY (US); Ulrich Baur, Weil In Schoenbuch (DE); Franco Motika, Hopewell Junction, NY (US)

(73) Assignee: Cadence Design Systems, Inc, San Jose, CA (US)

( * ) Notice: Subject to any disclaimer, the term of this patent is extended or adjusted under 35 U.S.C. 154(b) by 15 days.

(21) Appl. No.: 09/745,603

(22) Filed: Dec. 22, 2000

(65) Prior Publication Data

US 2002/0083386 A1 Jun. 27, 2002

(51) Int. Cl.$^7$ .............................................. G01R 31/28
(52) U.S. Cl. ....................... 714/726; 714/739; 714/741; 716/6; 703/14
(58) Field of Search ................................ 714/726–741, 714/30; 716/4, 6, 7; 703/14–19

(56) References Cited

U.S. PATENT DOCUMENTS

| | | | |
|---|---|---|---|
| 3,761,695 A | | 9/1973 | Eichelberger |
| 4,862,399 A | * | 8/1989 | Freeman ..................... 714/738 |
| 5,355,321 A | * | 10/1994 | Grodstein et al. .............. 716/6 |
| 5,422,891 A | * | 6/1995 | Bushnell et al. ............ 714/732 |
| 5,583,787 A | * | 12/1996 | Underwood et al. ........... 716/6 |
| 5,872,717 A | * | 2/1999 | Yu et al. ........................ 716/6 |
| 5,903,577 A | * | 5/1999 | Teene .......................... 714/724 |
| 5,983,380 A | * | 11/1999 | Motika et al. .............. 714/733 |
| 6,131,181 A | * | 10/2000 | Bushnell et al. ................ 716/4 |

(List continued on next page.)

OTHER PUBLICATIONS

Yen et al., "A path selection algorithm for timing analysis", ACM/DAC, 1988.*
Thompson et al., "Timing analysis for digital fault simulation using assignable delays", ACM/DAC, 1974.*
Chang et al., "VIPER: an efficient vigerously sensitizable path extractor", ACM/DAC 1993.*

(List continued on next page.)

Primary Examiner—Guy J. Lamarre
(74) Attorney, Agent, or Firm—Orrick, Herrington & Sutcliffe LLP

(57) ABSTRACT

For each logic gate in a logic circuit, all paths containing the gate are determined and the paths are classified by their length between each of the input or launch SRLs and each output or capture SRL. The paths are assigned a single threshold value and then divided into two groups in accordance with their path length classification relative to the threshold value with all paths in each group treated as a single path. Pseudo random LBIST patterns are then simulated using standard LBIST tool. When a fault associated with a logic gate is detected by a capture SRL of a path with a length above the threshold, the fault is viewed as tested and marked off from the fault list. When a fault is detected in any path that is below the threshold, it is not marked off and testing of the fault continues until testing patterns for all the paths of the group falling below the threshold value are simulated. When all the faults paths of the group falling below the threshold have been tested, a separate determined test generation program is activated. In the generated test, the fault is forced to propagate through the longest path above the threshold value.

16 Claims, 6 Drawing Sheets

U.S. PATENT DOCUMENTS

| | | | |
|---|---|---|---|
| 6,148,425 A | * 11/2000 | Bhawmik et al. | 714/726 |
| 6,237,127 B1 | * 5/2001 | Craven et al. | 716/6 |
| 6,247,154 B1 | * 6/2001 | Bushnell et al. | 714/733 |
| 6,327,686 B1 | * 12/2001 | Grundmann et al. | 714/738 |

OTHER PUBLICATIONS

Devaders, "Certified timing verification and the transition delay of a logic circuit", ACM/DAC, 1992.*

E. B Eichelberger & TWWilliams, "A Logic Design Structure for, LSI Testability", Proceedings of 14th Design Automation Conference New Orleans, 1977 pp 462–468.

PH Bardell 4 W H McAnney,"Self–Testing of Multichip Modules" Proceedings of IEEE International Test Conference, 1982 pp 200–204.

Jayabharathi, Chang & Abraham "Practice Considerations for Improving Delay Faults Tests Using a Unified Delay Fault Model," $7^{th}$ IEEE North Atlantic Test Workshops— 1998 pp 84–91.

* cited by examiner

RANDOM PATH DELAY TESTING METHODOLOGY

FIELD OF THE INVENTION

The present invention relates to testing of complex combinatorial and sequential logic circuits embodied in large scale integration (LSI) and very large scale integration (VLSI) circuit devices.

BACKGROUND OF THE INVENTION

A fault occurring anywhere in a LSI or VLSI circuit device can have its effect propagated through a number of feedback loops including storage or memory elements in the sequential logic before reaching a testable output of the device. Level sensitive scan design (LSSD) rules were devised to eliminate the complications in testing caused by this propagation through feedback loops. As described by E. B. Eichelberger and T. W. Williams in an article entitled "A Logic Design Structure for LSI Testability" on pages 462–468 of the Proceedings of the 14th Design Automation Conf., LSSD rules impose a clocked structure on logic circuit memory elements such as latches and registers, and require these memory elements be tied together to form a shift register scan path so that they are accessible for use as test input and output points. Therefore, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis. Patents describing LSSD techniques include U.S. Pat. Nos. 3,783,254; 3,784,907; 3,961,252, 4,513,418 and 5,983,380. The subject matter of these patents and the above described Eichelberger and Williams article are hereby included by reference.

Self-testing has been employed in connection with LSSD to reduce the time it takes to generate the test patterns and to perform the testing. Self-testing involves the use of pseudo-random pattern generators and response compression structures that are built into logic circuit devices. Using such pattern generators and compression structures eliminates the computer time needed to generate the tests and placing these testing elements on the device containing the logic allows the application of vast numbers of test patterns to the circuits in a reasonable period of time.

In the aforementioned U.S. Pat. No. 5,983,380, the shift register latches (SRLs) in the LSSD scan paths perform both input data launching and output data capturing. The test patterns come from the scan path that is configured into a linear feedback shift register (LFSR). The test data is then outputted into a multiple input shift register (MISR) for data compression. Alternate scan path shift cycles are applied to the SRLs exercising the combinational logic with the contents of the SRLs and capturing the results of the response back into the SRLs where they are used as test inputs for the next cycle. At the end of a calculated number of cycles, the contents of the scan path are read out as the signature to be compared with the desired value. Such self-testing is referred to as Logic Built-In Self-Test (LBIST).

Two types of LBIST tests are applied. One is DC-LBIST which uses the stuck-at fault model to generate and simulate the patterns. Another is AC-LBIST which uses the transition fault model to generate and simulate the patterns. In present AC-LBIST test methodology, a series of pseudo random patterns generated from LFSR are fed to logic through SRLs, as described above. During AC-LBIST simulation, when a fault resulting from the application of the pseudo random patterns is detected at a capturing latch, it is marked off from the fault list. That is, the fault is marked off as long as it reaches the capturing latch no matter the length of the path it traveled. Very often that detecting path is a short rather than a long one. As VLSI technology has evolved, increasing chip complexity and speed and shrinking circuit dimensions have made such small AC defects a more serious impediment to proper operation of the circuits being tested.

Therefore, it is an object of the present invention to provide improved LSSD testing methods and apparatus.

It is another object of the present invention to provide for more efficient testing of logic circuits for small AC delay defects.

It is a further object of the invention to provide improved AC-LBIST testing.

BRIEF DESCRIPTION OF THE INVENTION

In accordance with the present invention for each logic gate in a logic circuit, all paths containing the gate are determined and the paths are classified by their length between input or launch SRL and output or capture SRL. The paths through the logic gate are assigned a single threshold value and then divided into two groups in accordance with their path length classification relative to the threshold value with all paths in each group treated as a single path. A standard LBIST tool is used to apply pseudo random LBIST patterns to the logic circuit. When a fault associated with a logic gate is detected by a capture SRL of a path that is above the threshold, the fault is viewed as tested and marked off from the fault list. When a fault is detected in any path that is below the threshold, it is not marked off and testing of the fault continues until all pseudo random testing patterns for the group falling below the threshold value are performed. When pseudo random testing of the group falling below the threshold is completed, a separate test generation program is activated. In the generated test, the test patterns are forced to propagate through the longest path that is above the threshold value to complete testing for the remaining faults.

BRIEF DESCRIPTION OF THE DRAWINGS

These and other objects of the invention can best be understood reading the following description of the described embodiments thereof while making reference to the accompanying figures of which.

DETAILED DESCRIPTION OF THE INVENTION

Figure 1:
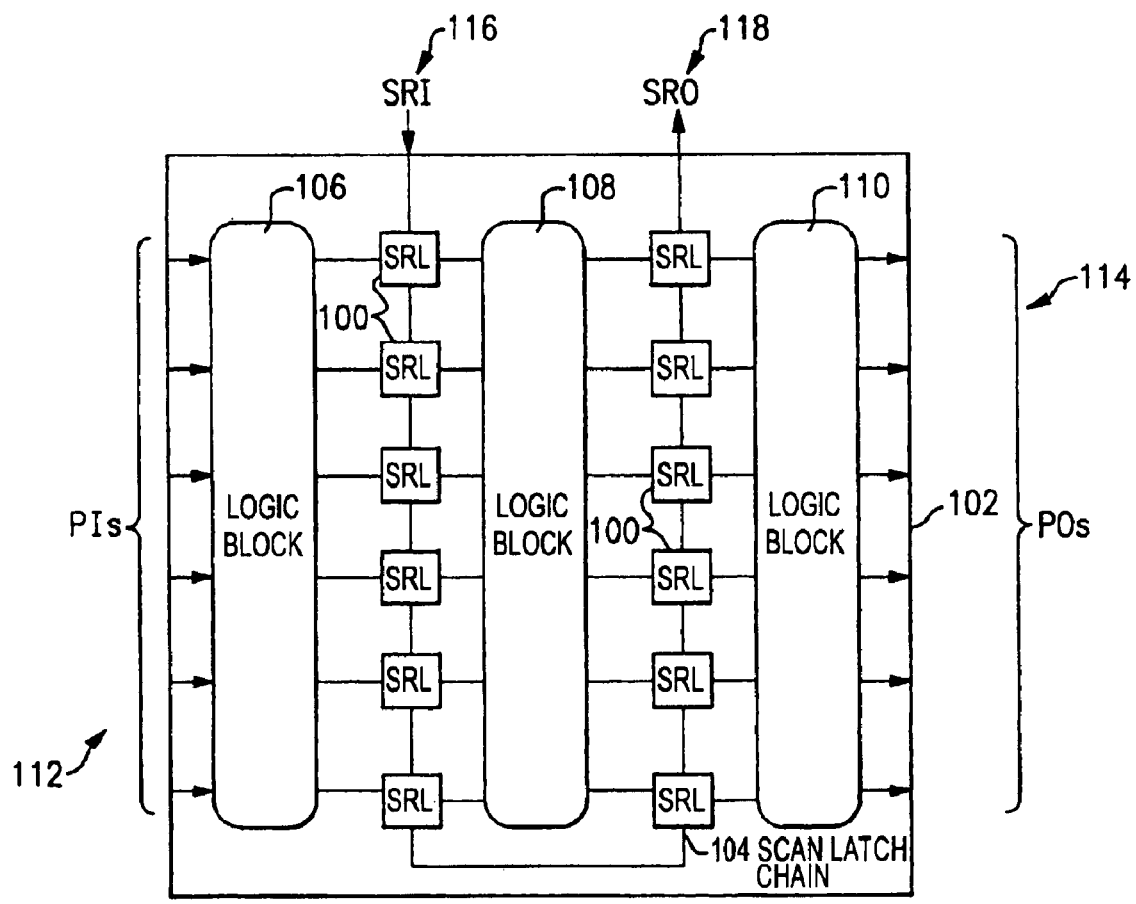
FIG. 1 is a schematic diagram of a VSLI logic chip with SRLs arranged in an LSSD chain.

FIG. 1 shows that in accordance with LSSD rules, shift register latches (SRL's) 100 on a semiconductor chip 102 are joined together to form a shift register LSSD scan latch chain 104 to facilitate testing of combinational logic blocks 106, 108 and 110 interconnected by the SRLs 100 of the scan latch chain 104. During circuit operation data is inputted to the combinational logic blocks 106, 108 and 110 and the SRLs 100 in a parallel through the primary inputs (PIs) 112 of the chip 102 and data is outputted from the combinational logic blocks 106, 108 and 110 and the SRLs 100 in parallel through the primary outputs (POs) vectors 114 of the chip 102. During testing, the scan chain latch circuits 104 can also be loaded serially. Serial input (SRI) 116 provides a serial input to the scan chain latch circuits 104 and serial output (SRO) 118 provides an output from scan chain latch circuits 104. Scanning inputs into the serial input SR 116 and out serial input 118 enables testing the SRLs 104 independently of the combinational logic 106, 108 and 110. It also allows each of the individual SRLs to be used as a pseudo-primary input or a pseudo-primary output for a combinational logic block 106, 108 or 110. The logic circuits in each of the logic blocks to be tested separately of circuits in other of the logic blocks. (While a single scan latch chain is shown here, it should be understood that it applies equally as well to latches arranged in multiple scan chains on the chip.)

Figure 2:
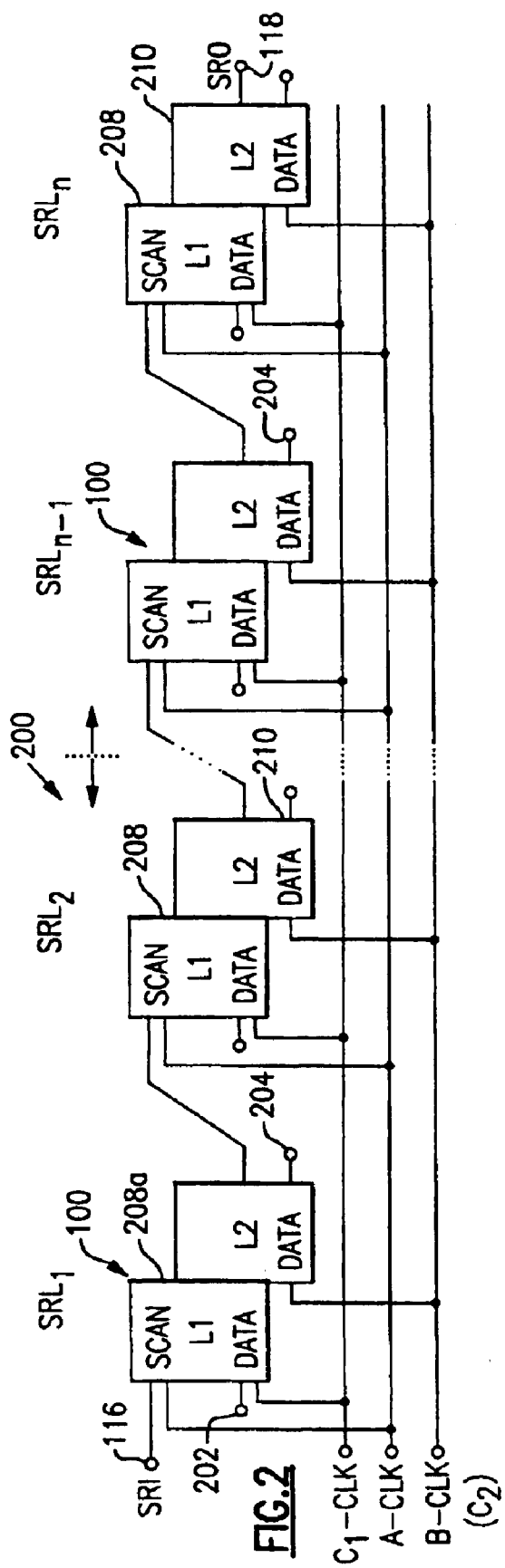
FIG. 2 is a schematic diagram of the SRL latches in an LSSD chain.

FIG. 2 shows a LSSD scan chain circuit 200. This chain circuit comprises a plurality of shift register latches (SRLs) 100 (herein designated as $SRL_1, SRL_2, \ldots, SRL_{N-1}, SRL_N$) in which each SRL 100 includes a master latch 208 and a slave latch 210. Each of the SRLs 100 contains data input terminal 202 from combinatorial logic circuits and an output terminal 204 to the combinatorial logic circuits in the combinatorial logic 106, 108 or 110.

In addition, data can be provided to the SRI terminal 116 and be transferred from one SRL to another to the SRL 118. As described below, data is clocked into each SRL 100 by applying a clock pulse to master latch 208, and data is clocked out of each SRL 100 by applying a clock pulse to slave latch 210. Data is output from slave latch 210 to a succeeding master latch 208. For this purpose, the operation of the LSSD scan chain 200 is controlled by scan clock signals on the a-clk, b-clk and c-clk lines. Serial loading of the master latch 208a from the SRL 116 occurs upon generation of an a-clk pulse on a-clk line. The a-clk pulse on a-clk line causes serial input applied to the SRLs 100 to be inputted to each master latch 208. Application of a b-clk on b-clk line causes data to be output from the SRLs via slave latches 210. The continuous, alternating application of a-clk and b-clk clock pulse signals on the a-clk and b-clk lines respectively sequentially propagates a data signal applied to SRI 116 through scan chain 200 to SRO 118. To effect a parallel load, a $c_1$-clk block pulse is applied to $c_1$-clk line. This causes a parallel load of data via parallel data inputs 202 and combinational logic to each master latch 208 of the SRLs 100. Application of a b-clk or $c_2$-clk pulse to the b-clk line causes a parallel output of data from each slave latch 210 of SRLs 100 to provide data on respective parallel output data lines 204.

Figure 5:
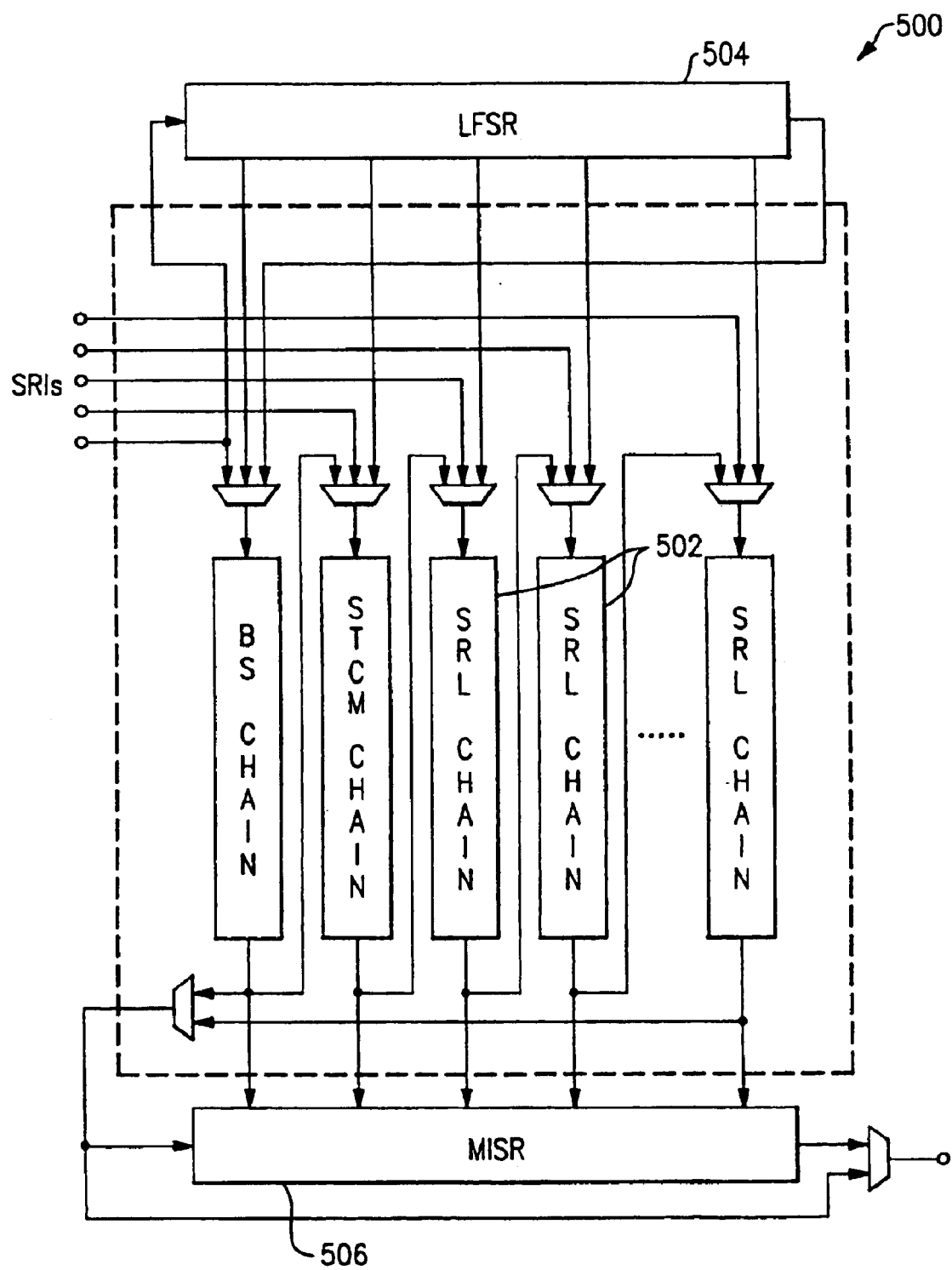
FIG. 5 is a schematic diagram of LBIST test circuits.

As previously mentioned, self-testing is employed in connection with LSSD to reduce the time it takes to generate the test patterns and to perform the testing. Self-testing involves the use of pseudo-random pattern generators and response compression structures that are built into logic circuit devices. Using such pattern generators and response compression structures eliminates the computer time needed to generate the tests while placing these testing elements on the device containing the logic allows the application of vast numbers of test patterns to the circuits in a reasonable period of time. FIG. 5 shows a typical configuration for a LBIST circuit 500, shown in the above mentioned U.S. Pat. No. 5,983,380. In that LBIST circuit, SRLs in the SRL chains 502 perform both input data launching and output data capturing. The test patterns come from a scan path that is configured into a linear feedback shift register (LFSR) 504. The test data is then outputted into the multiple input shift register (MISR) 506 for data compression. Alternate scan path shift cycles are applied to the SRLs exercising the combinational logic with the contents of the SRLs and capturing the results of the response of the combinational logic back into the SRLs where they are used as the test inputs for the next cycle. At the end of the requisite number of cycles the contents of the scan path is read out as the signature to be compared with the desired value.

The use of pseudo random test patterns in this manner generally ensures that the circuit chip will operate properly, but the applied test patterns do not necessarily test all logic paths on the chip. As the operational speed of circuit chips has increased, small AC defects in untested logic paths have become a more serious problem and the problem is expected to worsen as the circuit chip densities and operational speeds continue to increase.

Figure 3:
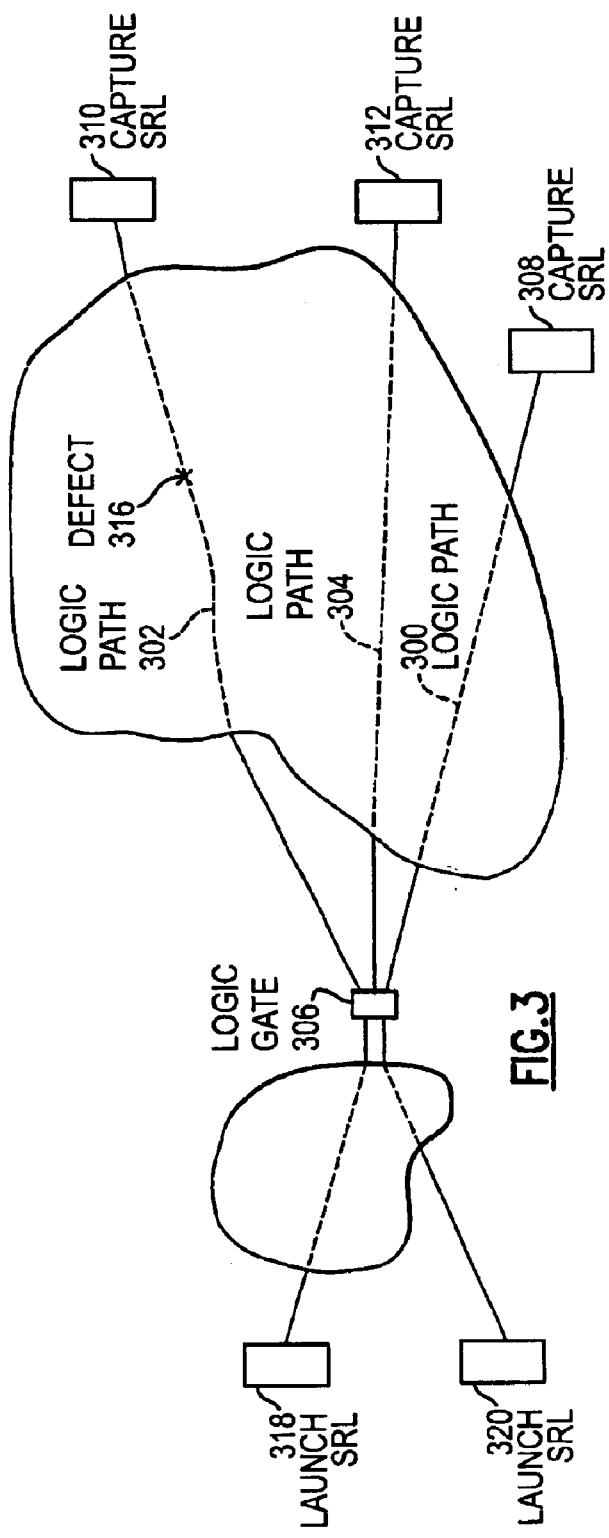
FIG. 3 is a schematic diagram illustrating multiple logic paths through a single gate.
Figure 4:
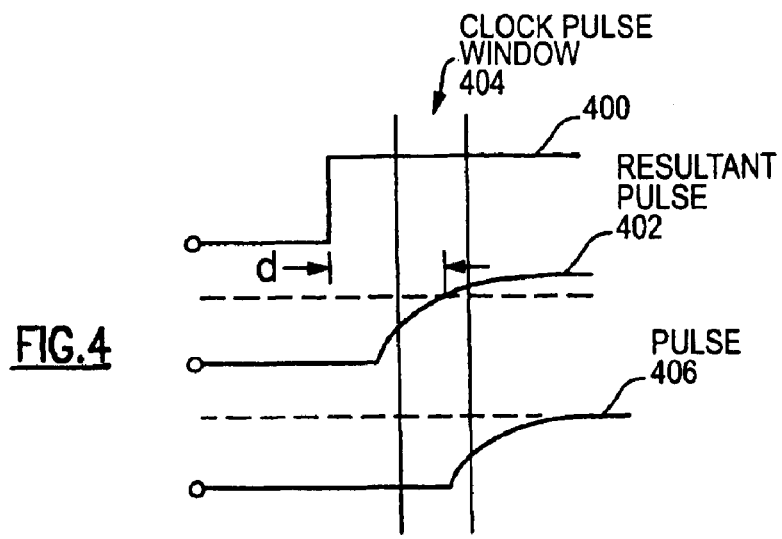
FIG. 4 is a graph of signal and clock pulses that illustrates an AC delay fault.

An example of a small AC defect problem is shown in FIGS. 3 and 4. As shown in FIG. 3, combinational logic paths 300, 302 and 304 connect a logic gate 306 to multiple output or capture SRLs 308, 310 and 312. As shown in FIG. 4, a small delay defect in this logic gate 306 or may not cause an operational delay failure. If the resultant pulse 402 at the capture SRL is sufficiently large to be captured during the clock pulse window 404, the delay, d, in its transition goes undetected. However, the pulse 406 may not rise sufficiently during the window to be picked up by the capture SRL. Therefore, in FIG. 3 in testing, a small AC defect of the logic circuit 306 may not be captured in the short path 300 because the pulse 406 is sufficiently large to be captured by the SRL 308. But, when the delay defect is combined with the delay in the longer path 304, the SRL will not latch and the defect will be noted. Both paths 300 and 304 would then be tested for the AC fault. However, the longest path 302 would not be considered tested and may contain further defects 316.

In accordance with the present invention, all paths through each logic circuit 306 between each launch SRL 318 or 320 and each capture SRL 308 to 312 are determined and assigned a fault list containing possible faults that may arise along the particular path. This results in 6 separate paths through logic gate 306.

Figure 8:
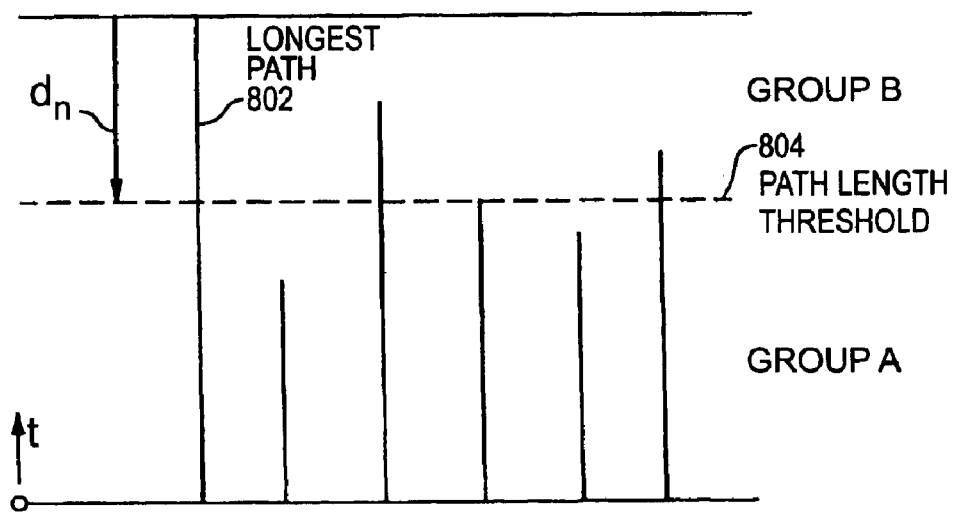
FIG. 8 is a graph illustrating path length relative to the threshold level.

As shown in FIG. 8, the 6 paths are then classified based on their length. In other words, a nominal acceptable delay in the use or fall times of pulses generated by a gate is assumed and the paths are classified in accordance with the time it should take for a pulse to propagate from the launch SRL to the capture SRL of the path. The nominal delay time is then marked off through the time it takes for propagation against the longest path 802 to establish a path length threshold 804. All paths whose "path length" or transit time falls below this threshold are classified as in group A and the paths of group A are treated as if they are a single path. All paths with transit times above the threshold are classified as in group B and the paths of group B as treated as a single path.

Figure 6:
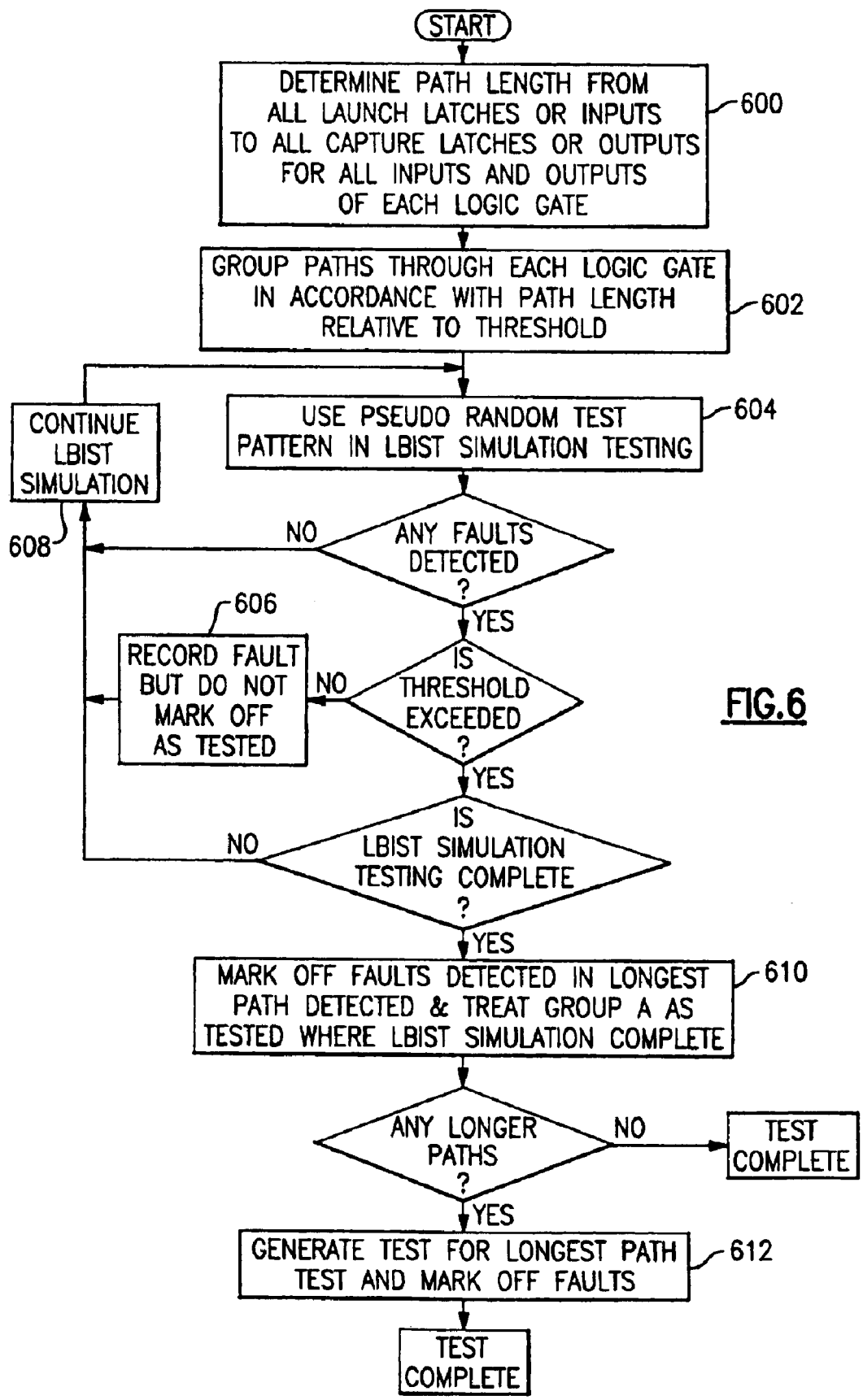
FIG. 6 is a flow diagram of an LBIST test in accordance with the present invention.
Figure 9:
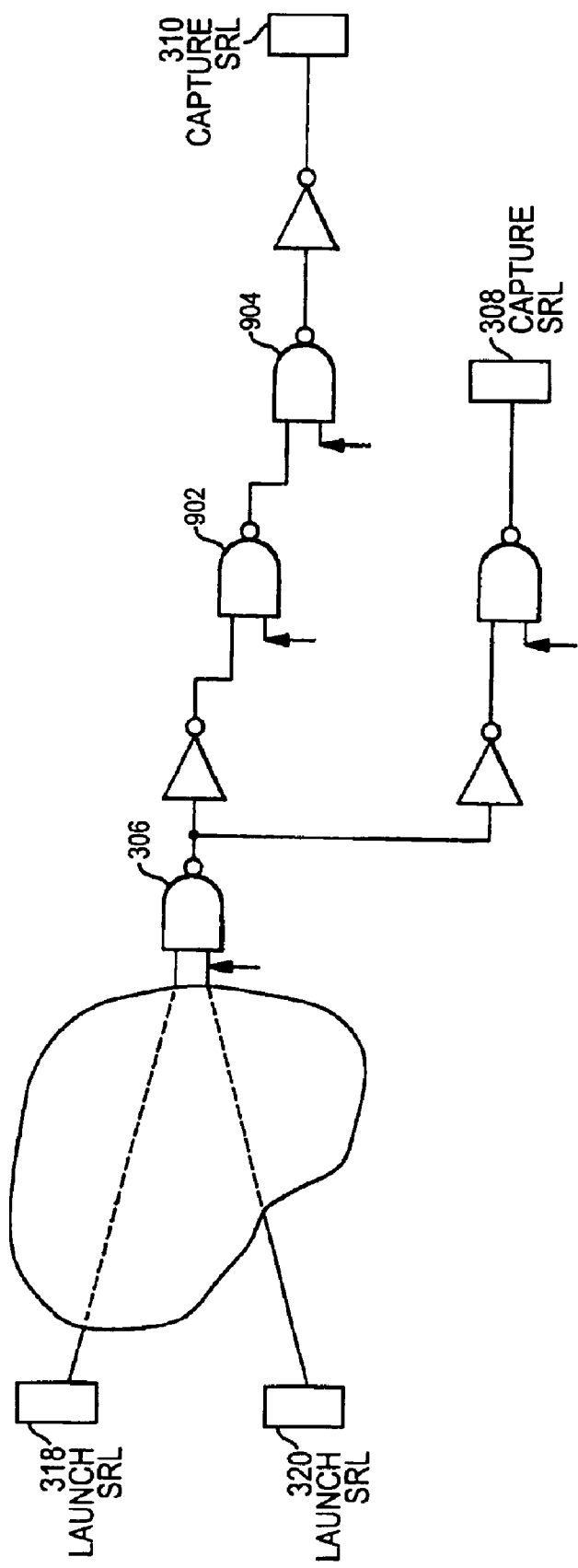
FIG. 9 is a circuit schematic illustrating the performance of the generated test.

As shown in FIG. 6, for each gate in the logic circuit the paths to their input and output latches are determined (step 600). As described above with respect to FIG. 8, the paths are then classified in accordance with path length and the paths divided into groups A and B in accordance with those path lengths, with all paths in either group treated as a single path, and assigned a single threshold level (step 602). LBIST simulation is then performed using pseudo random testing the standard LBIST tool (step 604). When a fault is detected in any path below the threshold level, the fault is not considered as tested and not marked off (step 606) and pseudo random testing for the fault continues until all paths within group A are tested (step 608). When a fault is propagated through a path that is above the threshold level, the fault is viewed as tested and it is marked off from the fault list as tested in the longest path it is detected (step 610). For the faults that have not been tested through the long paths, they are not marked off and they are passed to the deterministic test pattern generation step (step 612). As shown in FIG. 9, in test generation a fault is forced to propagate through the longest path 802 through gate 306 from launch latch 318 to capture latch 310 by the activation of the inputs to AND gates 306, 902 and 904.

Figure 7:
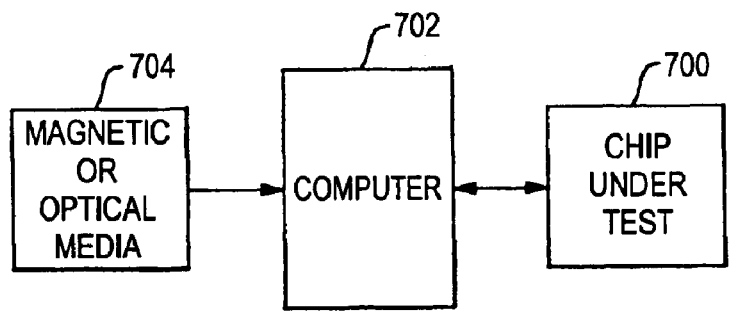
FIG. 7 is a block diagram of a computer testing set up.

As shown in FIG. 7, the testing algorithm to test a chip 700 can be provided to the testing computer 702 on magnetic or optical media 704.

Above one embodiment of the invention has been described. However, it should be understood that the invention is not limited to the disclosed embodiment but includes all changes that can be made in that embodiment without departing from the spirit and scope of the appended claims.

We claim:

1. A method of testing a combinational and sequential logic circuit including a plurality of logic units coupled to form a shift register scan path for testing the logic circuits and being configured to uncouple to disable the scan path while the logic circuit is performing a designed logic function, comprising:
   (a) dividing all the logic paths through a logic gate into two groups based on whether signal transit time of their path from a launch latch to a capture latch is faster or slower than a threshold level;
   (b) performing simulation testing by shifting a plurality of pseudo random pulse patterns through said paths to detect faults on fault lists for the paths;
   (c) determining if a fault occurred during simulation testing in paths with transit times longer than the threshold level and checking off of the fault from the fault list;
   (d) checking for a longer path above the threshold with faults unexercised by the simulation testing; and
   (e) generating a test for the longer path for forcing an untested fault through the longer path.

2. The method of claim 1 including the step of treating the paths in either group as a single path.

3. The method of claim 1 including the step of basing the threshold value on an accepted pulse rest time relative to the longest path.

4. The method of claim 3 including the steps of:
   (f) treating all paths in the group containing the shorter transit times as tested when the threshold is exceeded in simulation test of step (b); and
   (g) treating all paths in the group containing the longer path as tested when the longest path in that group has been tested using the test generated in step (c).

5. The method of claim 4 including the step of not marking off faults detected in path with a transit time shorter than the threshold.

6. The method of claim 5 including the step of marking of a detected fault in the longest path in which it is detected.

7. An apparatus for testing combinational and sequential logic circuit including a plurality of individual logic units coupled to form a shift register scan path for testing the logic circuit and being configured to uncouple to disable the scan path while the logic circuit is performing its a designed logic function, comprising:
   (a) means for dividing all the logic paths through a logic gate into two groups based on whether signal transit time of their path from a launch latch to a capture latch is faster or slower than a threshold level;
   (b) means for performing simulation testing by shifting a plurality of pseudo random pulse patterns through said paths to detect faults on fault lists for the paths;
   (c) means for determining if a fault occurred during simulation testing in paths with transit times longer than the threshold level and checking off of the fault from the fault list;
   (d) means for checking for a longer path above the threshold with faults unexercised by the simulation testing; and
   e) means for generating a test for the longer path for forcing an untested fault through the longer path.

8. The apparatus of claim 7 including means for treating the paths in either group as a single path.

9. The apparatus of claim 7, further comprising:
   (f) means for treating all paths in the group containing the shorter transit times as tested when the threshold is exceeded in the simulation testing (b); and
   (g) means for treating all paths in the group containing the longer path as tested when the longest path in that group has been tested by the means of determining.

10. The apparatus of claim 9 including means for not marking off faults detected in path with a transit time shorter than the threshold.

11. The apparatus of claim 10 including means for marking off a detected fault in the longest path in which it is detected.

12. A method of testing a combinational and sequential logic circuit including a plurality of logic units coupled to form a shift register scan path for testing the logic circuit and being configured to uncouple to disable the scan path while the logic circuit is performing a designed logic function, comprising the steps of:
   (a) dividing all the logic paths through a logic gate into two groups based on whether signal transit time of their path from a launch latch to a capture latch is faster or slower than a threshold level, the threshold value being based on an accepted pulse rest time relative to the longest path;
   (b) performing simulation testing by shifting a plurality of pseudo random pulse patterns through said paths to detect faults on fault lists for the paths;
   (c) determining if a fault occurred during simulation testing in paths with transit times longer than the threshold level and checking off of the fault from the fault list;
   (d) checking for a longer path above the threshold with faults unexercised by the simulation testing;
   (e) generating a test for the longer path for forcing an untested fault through the longer path;
   (f) treating all paths in the group containing the shorter transit times as tested when the threshold is exceeded in simulation test of step (b); and
   (g) treating all paths in the group containing the longer path as tested when the longest path in that group has been tested using the test generated in step (c).

13. The method of claim 12, further including not marking off faults detected in path with a transit time shorter than the threshold.

14. The method of claim 13 including the step of marking of a detected fault in the longest path in which the detected fault is detected.

15. The method of claim 12, further including generating testing sequences for self-testing the logic circuit.

16. The method of claim 12, further including compressing responses from the logic circuit.

* * * * *